United States Patent [19]

Ohmura et al.

[11] 4,401,521
[45] Aug. 30, 1983

[54] METHOD FOR MANUFACTURING A FINE-PATTERNED THICK FILM CONDUCTOR STRUCTURE

[75] Inventors: Kaoru Ohmura; Ryohei Koyama; Takeo Kimura, all of Fuji, Japan

[73] Assignee: Asahi Kasei Kogyo Kabushiki Kaisha, Osaka, Japan

[21] Appl. No.: 323,337

[22] Filed: Nov. 20, 1981

[30] Foreign Application Priority Data

Nov. 28, 1980 [JP] Japan .............................. 55-166614
Jun. 16, 1981 [JP] Japan .............................. 56-91479

[51] Int. Cl.³ .......................... C25D 1/00; C25D 1/20
[52] U.S. Cl. ......................................... 204/12; 204/281
[58] Field of Search .......................... 204/11, 12, 281

[56] References Cited

U.S. PATENT DOCUMENTS

| | | | |
|---|---|---|---|
| 2,447,541 | 8/1948 | Sabee | 204/12 |
| 2,874,085 | 2/1959 | Brietzke | 204/12 |
| 2,984,595 | 5/1961 | Schumpelt | 204/281 |
| 3,024,151 | 3/1962 | Robinson | 204/15 |
| 3,152,938 | 10/1964 | Osifchin et al. | 156/3 |
| 3,414,487 | 12/1968 | Helms | 204/11 |
| 3,704,207 | 11/1972 | Burtis | 204/15 |
| 3,990,926 | 11/1976 | Konicek | 204/15 |
| 4,159,222 | 6/1979 | Lebow et al. | 204/15 |

FOREIGN PATENT DOCUMENTS 1258856 12/1971 United Kingdom .................. 204/15
2066583 7/1981 United Kingdom .................. 204/15

Primary Examiner—T. M. Tufariello
Attorney, Agent, or Firm—Sprung, Horn, Kramer & Woods

[57] ABSTRACT

A method for manufacturing a fine-patterned thick film conductor structure free from ununiformity in film thickness comprises steps of forming resist on a thin metal plate at areas other than land areas, electroplating the thin metal plate using the thin metal plate as a cathode electrode to form conductors having a circuit density of no less than three lines/mm and a thickness of 15–200 μm, bonding the electroplated thin metal plate to an insulative substrate with the thin metal plate side facing up and etching the thin metal plate. The fine-patterned conductors are suited for use in small-sized coils, high density connectors and high density wirings.

Further disclosed is a method for manufacturing a fine-patterned thick film printed circuit board free from side protrusion comprising steps of forming resist on a thin metal plate at areas other than land areas, electroplating the thin metal plate to a thickness of 0.3–10 μm at a current density of 0.05–2 A/dm², electroplating the thin metal plate to a desired final thickness at a current density of 3–20 A/dm², and removing all or the areas other than the land areas of the thin metal plate.

21 Claims, 7 Drawing Figures

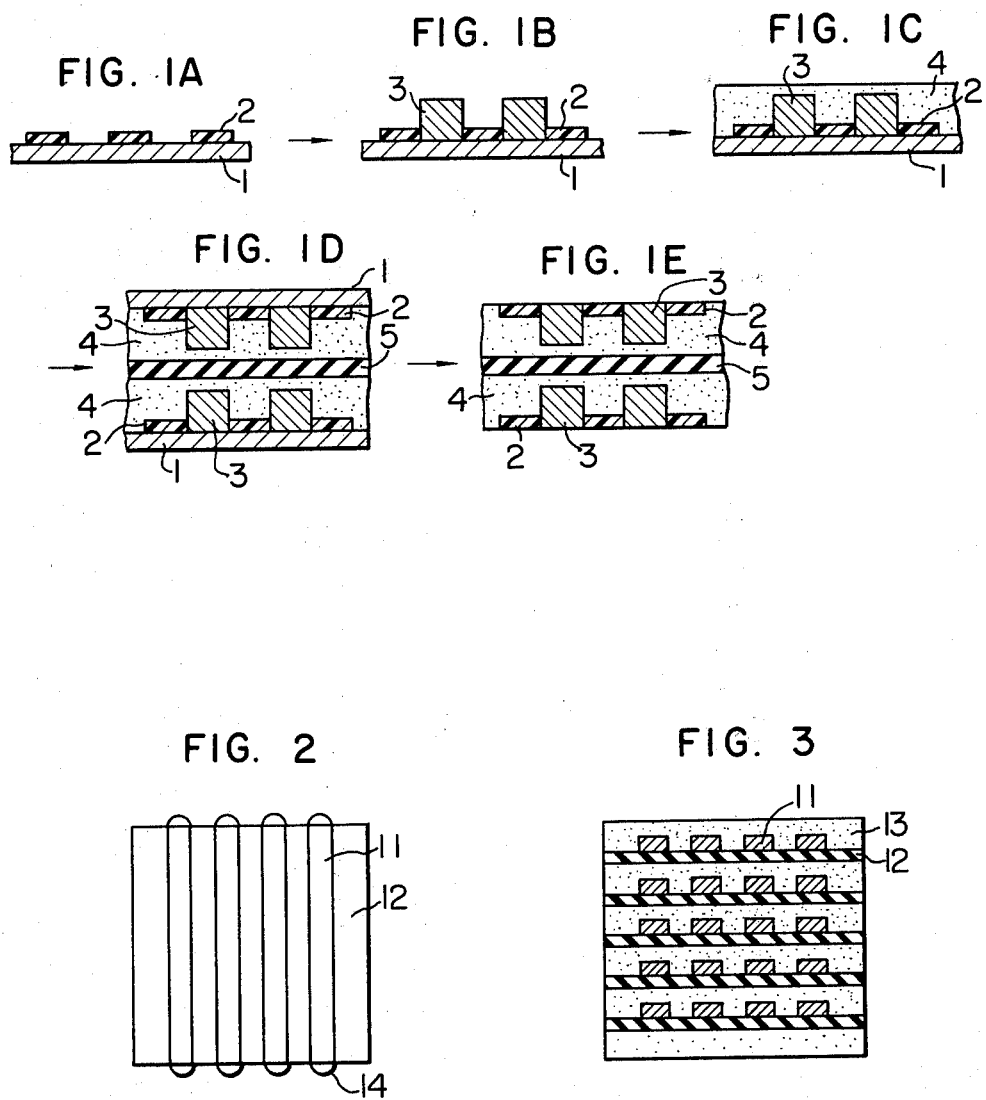

METHOD FOR MANUFACTURING A FINE-PATTERNED THICK FILM CONDUCTOR STRUCTURE

CROSS-REFERENCES TO THE RELATED APPLICATIONS

This application relates to the application U.S. Ser. No. 219,155 filed on Dec. 22, 1980 and assigned to the present assignee.

BACKGROUND OF THE INVENTION

The present invention relates to an improved method for manufacturing a fine-patterned thick film conductor structure and a method for manufacturing a printed circuit board using the same.

The fine-patterned thick film conductor structure has been required in the fields of small size coils, high package density connectors and high circuit density wirings in which high magnitude current is used. Coils have usually been manufactured by winding wires. In this method, however, it is difficult to manufacture the small size coils and the windings have variance. A so-called printed coil having an etched copper foil having a thickness of several tens microns cannot attain a fine pattern because of side etching which extends to the extent of double of the thickness. It can attain a pattern of 2 to 3 lines/mm at most. Accordingly, it is difficult to manufacture the small size coil by this method. (See, for example, U.S. Pat. No. 3,269,861.) In recent years, as the motors for cassette tape recorders and VTR's have been miniaturized, it has been desired to develop and put into practice a fine coil having a fine-patterned thick film conductor structure.

The inventors of the present invention have proposed, in the above-referenced copending U.S. application Ser. No. 219,155, a method for manufacturing a high density fine-patterned thick film conductor structure which is free from shortcircuit due to the thickening of the conductors, by thickening a thin film conductor pattern having a thickness of 0.1-10 $\mu$m formed on an insulative substrate by electroplating conductor in the condition of a cathode current density of no less than 5 A/dm$^2$. However, when the thin film conductor pattern is directly electoplated, the thickness of the plated layer is not uniform if the length of the fine-patterned conductor structure exceeds that corresponding to a resistance of 5 ohms. In another method in which an unpatterned thin film conductor structure formed on an insulative substrate is electroplated with a resist pattern mask being placed thereon, it is necessary to remove the resist and etch away narrow lines of the fine pattern. Thus, this method includes a number of steps and requires high accuracy of process.

SUMMARY OF THE INVENTION

It is an object of the present invention to provide a method for manufacturing a fine-patterned thick film conductor structure having a uniform thickness.

It is another object of the present invention to provide a simple and accurate method for manufacturing a fine-patterned thick film conductor structure.

It is a further object of the present invention to provide a method for manufacturing a fine-patterned thick film conductor structure having high reliability.

According to the present invention, there is provided a simple method for manufacturing a fine-patterned thick film conductor structure free from thickness variance and having high reliability, which method includes steps of forming a resist on a thin metal film at areas other than land areas, electroplating the land areas using the thin metal film as a cathode electrode to form a conductor structure having a thickness of 15 to 200 $\mu$m, preferably 100 to 200 $\mu$m for the provision of low-resistance conductor, and a circuit density of no less than 3 lines/mm, bonding the resulting conductor structure to an insulative substrate by bonding agent with the thin metal film facing up and etching away the thin metal film. The conductor structure thus electroplated has a uniform thickness because the thin metal film having a low electrical resistance is used as an underlying layer for plating.

BRIEF DESCRIPTION OF THE DRAWINGS

FIGS. 1A to 1E show manufacturing steps for explaining one embodiment of the present invention, and FIGS. 2 and 3 shows a plan view and a sectional view, respectively of a high density connector manufactured by the present invention.

DESCRIPTION OF THE PREFERRED EMBODIMENTS

Referring to FIGS. 1A to 1E, numeral 1 denotes a thin metal film, numeral 2 denotes a plating resist, numeral 3 denotes a plated conductor (land), numeral 4 denotes a bonding material and numeral 5 denotes a insulative substrate.

The thin metal film used in the present invention may be any conductor which can be etched, and preferably it has an etching property different from that of the electroplated conductor. In the latter case, the electroplated conductor is not etched when the thin metal film is etched so that high precision thin metal film etching is attained. Preferable materials are aluminum, tin and zinc. A preferable range of the film thickness is 1–500 $\mu$m, more preferably 5–200 $\mu$m and most preferably 10–100 $\mu$m. When the film thickness is less than 1 $\mu$m, it is hard to handle and the thickness of the plated layer is apt to be ununiform. When the film thickness is more than 500 $\mu$m, long time is required for etching and productivity is reduced.

The application of the resist to the areas other than the land areas may be effected by screen printing or photographic printing, and preferably it is formed using a photoresist which allows the formation of the fine pattern. The application method may include an application step, an exposing step and a developing process. The photoresist may be a negative photoresist such as Eastman Kodak KPR, KOR, KPL, KTFR, KMER, Tokyo Ohka Kogyo TPR, OMR 81 or Fuji Yakuhin Kogyo FSR, or a positive photoresist such as Eastman Kodak KADR or Shipley AZ-1350. Those having high plating resistance are preferred and the negative photoresists are preferred. A dry film resist may also be used. The thicker the film thickness is, the more effective is it to prevent the widthwise thickening of the plated layer but when the thickness is too large the fine pattern cannot be attained. A preferable range is 0.1–50 $\mu$m, and more preferably 1–10 $\mu$m. When the thickness is less than 0.1 $\mu$m, a pinhole is apt to be produced.

The electroplating material may be any conductor, preferably silver, gold, copper, nickel and tin, and copper is most preferable from the standpoint of conductivity and economy. The plating bath may be silver cyanide bath for plating silver, acidic, neutral or alkaline bath for plating gold and nickel sulfate bath or nickel sulfonate bath for plating nickel.

In electroplating copper, copper cyanide plating bath, copper pyrophosphate plating bath, copper sulfate plating bath or copper borofluoride plating bath may be used. The copper pyrophosphate plating bath is preferable. An important factor in electroplating the fine-patterned conductor sturcture is a current density at a cathode electrode. When the cathode current density is small, the widthwise thickening is larger than the thicknesswise thickening. A preferable range of the cathode current density is more than 3 A/dm$^2$, more preferably more than 5 A/dm$^2$, and most preferably more than 8 A/dm$^2$. As the cathode current density increases, the widthwise thickening is suppressed. High cathode current density is also advantageous to a pulse plating method. The upper limit of the cathode current density is determined by burning and it is 50 A/dm$^2$, preferably 20 A/dm$^2$.

Another important factor in the electroplating is a ratio of the plated layer thickness to the spacing bewtween the lands. When the ratio is no smaller than 1.4, more preferably no smaller than 2.0 with the cathode current density specified above, the widthwise thickening is further suppressed and the conductor is plated thicknesswise selectively.

The above phenomena are remarkable when the adjacent lands are at an equal potential. The present invention makes use of this effect to a maximum extent. A preferable range of the plated layer thickness is 15–200 $\mu$m and the present invention is effective particularly when the plated layer thickness is large. It is suited to manufacture the fine-patterned thick film having a thickness of no less than 20 $\mu$m or even no less than 35 $\mu$m. It is further suited to manufacture the fine-patterned thick film having a wiring density of no less than 3 lines/mm or even no less than 5 lines/mm. It is suited to manufacture the fine-patterned thick film having an occupation rate of land areas of no less than 50% or even no less than 70%.

When the thin metal film is electroplated, protrusions may be formed at a side of the resulting conductor line depending on the condition of the electroplating, particularly the current density condition. The adhesive force between the thin metal film and the electroplated layer is also materially affected by the electroplating condition. The protrusions at the side of the conductor line and poor adhesive force of the plated layer to the substrate are apt to reduce the reliability and the yield of the fine-patterned thick film conductor structure in a mass production process thereof.

In order to resolve the above problem, the lands are plated at a low current density in an initial stage of the electroplating and then the conductor lines are formed on the thin metal film at the current density specified above. With this process, the protrusions in the sides of the conductor lines are prevented and the adhesive force of the plated layer to the thin metal layer is enhanced. While the reason therefor is not well understood, it is considered that the generation and the growth of nucleoli in the initial stage of the electroplating are related to the current density or the residual stress of the plated layer is relieved.

Specifically, in the electroplating process of the thin metal film, the electroplating is carried out at a current density of 0.05–2 A/dm$^2$, preferably 0.1–1.5 A/dm$^2$ to get the film thickness of 0.3–10 $\mu$m, preferably 0.5–5 $\mu$m in the first stage, and the electroplating is carried out thereafter at the current density specified above to get the desired film thickness.

When the current density is more than 2 A/dm$^2$, sufficient adhesive force of the plated layer to the thin metal layer is not attained, and when the current density is less than 0.05 A/dm$^2$ the plating time is too long and the productivity is reduced. When the film thickness is smaller than 0.3 $\mu$m, a sufficient adhesive force is not attained, and when it is larger than 10 $\mu$m, the plating time is too long and the productivity is reduced.

The insulative substrate used in the present invention may be a film substrate, a laminated substrate, a glass structure, a ceramic substrate or a metal substrate coated with an insulative layer. A polymer film substrate is particularly preferable.

The polymer film substrate may be any film substrate such as polyester film, epoxy film, polyimide film, polyparabanic acid film and triazine film. The polyimide film, polyparabanic acid film and triazine film are preferable from the standpoint of flexibility and heat resistivity. The film thickness of the polymer film substrate is preferably as small as possible from the standpoint of high packaging density but too thin film spoils the workability. A preferable range of the film thickness is 5–200 $\mu$m, more preferably 10–150 $\mu$m and most preferably 10–100 $\mu$m.

The application of the electroplated thin metal film to the insulative substrate with the thin metal film facing up may be advantageously carried out by hot-pressing it with a bonding agent. When the bonding agent is used, the substrate may not be used and the bonding agnet may be simply applied on the plated layer, or the plated layers with the bonding agent applied thereon may be stacked one on the other. The insulative substrate is preferable from the standpoint of insulation. The term "insulation" herein means the insulation between a front conductor pattern and a back conductor pattern bonded on the opposite surfaces of insulative substrate. If the insulation is poor, the front and back conductor patterns may be shortcircuited.

The bonding agent may be polyester-isocyanate, phenol resin-butyrale, phenol resin-nitrile rubber, epoxy-nylon, epoxy-nitrile rubber or epoxy-phenol resin. Those having high heat resistance, high humidity resistance and high bonding property are preferable, and the epoxy-phenol resin, epoxy-nitrile rubber and phenol resin-nitrile rubber bonding agents are particularly preferable. A preferable range of the thickness of he bonding agent is 1–200 $\mu$m and more preferably 2–100 $\mu$m from the standpoint of high packaging density and adhesive force.

The fine-patterned thick film conductor structure of the present invention may be bonded to only one surface of the insulative substrate but preferably it is bonded to both surfaces of the substrate to enhance the packaging density. In the latter case, the insulative substrate may be drilled to allow the through-hole connection. It may be stacked one on the other.

The through-hole connection may be carried out by drilling the through-holes and inserting conductive material such as solder or conductive paste in the holes, or plating the inner walls of the holes by conductive material.

The etching of the thin metal film may be effected by spray etching or dip etching with etchant which dissolves the thin metal film used. When the thin metal film is aluminum, tin or zinc, it is preferable to use alkaline solution or dilute hydro-chloric acid solution which does not etch the electroplated conductor. When necessary the exposed conductor after the thin metal film has been etched may be further electroplated to thicken it so that thicker film conductor structure is attained. In this case, by carrying out the electroplating after the thin metal film has been etched and the through-hole have been drilled, the through-hole connection is simultaneously attained. The through-holes may be drilled before the thin metal film is etched.

In order to enhance the reliability, a protective layer such as polymer layer is formed after the thin metal film has been etched.

The fine-patterned thick film conductor structure manufactured by the present invention has a small resistance because of a large sectional area and is suitable for use in a small-sized coil, a high density connector and a high density wiring. A coil having a spiral pattern is of small size and high performance.

FIGS. 2 and 3 show a plan view and a longitudinal sectional view, respectively, of a high density connector. Conductor lands 11 are formed on insulative substrates 12 which are bonded together by insulative bonding layers 13 to form a multilayer structure. Connecting terminals 14 are provided at ends of the conductor lands.

In order to more clarify the aspects of the present invention, several examples are explained below although the present invention is not limited to those examples and various modifications may be made.

EXAMPLE 1

A negative photoresist Eastman Kodak "Microresist 747" was applied to have a dried thickness of 3 $\mu$m on an aluminum thin plate having dimensions of 8 cm × 8 cm and thickness of 40 $\mu$m. After it was prebaked, it was exposed to a high voltage mercury lamp through a circuit pattern mask, developed by specified developing liquid and rinsing liquid, dried and postbaked to form the resist at the areas other than the land areas (FIG. 1A).

Then, using copper pyrophosphate plating bath prepared by Harshaw Murata Co., Ltd., copper was electroplated to a thickness of 2 $\mu$m at a cathode current density of 0.5 A/dm$^2$ with the aluminum thin plate being used as a cathode electrode, and thereafter copper was electroplated to have a total thickness of 100 $\mu$m at the cathode current density of 8 A/dm$^2$ (FIG. 1B). Phenol resin-nitrile rubber bonding agent Bostik "XA 564-4" was applied to have a dried thickness of 5 $\mu$m on a polyimide film DuPont "Kapton" (having a thickness of 25 $\mu$m) to form an insulative substrate. The electroplated aluminum thin plate to which bonding agent was applied as shown in FIG. 1C as required, was hot pressed to the insulative substrate at 150° C. for 30 minutes with the aluminum thin plate side facing up (FIG. 1D). The aluminum plate was then etched way by 14% by weight aqueous solution of hydrochloric acid to produce a fine-patterned thick film conductor structure having a circuit density of 10 lines/mm, thickness of 100 $\mu$m, line width of 85 $\mu$m, line-to-line spacing of 15 $\mu$m and no ununiformity in the film thickness (FIG. 1E). FIGS. 1D and 1E show an example in which conductor patterns are bonded on the both sides of the insulative substrate 5. The roughness of the film thickness was within ±5%. For the purpose of comparison with a conventional method, copper was vapor deposited to the thickness of 0.5 $\mu$m on an entire surface of a Kapton film and the same circuit pattern as that of the Example 1 was formed by photoetching process. It was electroplated in a similar manner to form an electroplated conductor pattern. The uniformity of the resulting film thickness was ±50%.

EXAMPLE 2

A negative photoresist Eastman Kodak "Microresist 752" was applied to have a dried thickness of 3 $\mu$m on one side on a tin thin plate having dimensions of 8 cm square and a film thickness of 20 $\mu$m. It was prebaked exposed to a high voltage mercury lamp through a circuit pattern mask, developed by specified developing liquid and rinsing liquid, dried and postbaked to form the resist at the areas other than the land areas.

Then, using copper pyrophosphate plating bath prepared by Harshaw Murata, copper was electroplated to the thickness of 0.5 $\mu$m at a cathode current density of 0.1 A/dm$^2$ with the tin thin plate being used as a cathode electrode, and then copper was electroplated to have a total thickness of 50 $\mu$m at a cathode current density of 10 A/dm$^2$. Phenol resin-nitrile rubber bonding agent Bostik "XA564-4" was applied on both sides of a polyimide film DuPont "Kapton" (having a film thicknes of 25 $\mu$m to have a dried film thickness of 5 $\mu$m on each side to form an insulative substrate. The electroplated tin thin plates were hot pressed to both sides of the insulative substrate at 150° C. for 30 minutes. The tin thin plates were etched by a 5% by weight aqueous solution of sodium hydroxide. Through-holes were drilled and through-hole connection was made using conductive paste Epoxy Technology "H-31D" to produce a fine patterned thick film conductor structure having a circuit density of 15 lines/mm, film thickness of 50 $\mu$m, line width of 57 $\mu$m line-to-line spacing of 10 $\mu$m and no ununiformity in the film thickness.

EXAMPLE 3

A negative photoresist Eastman Kodak "Microresist 747" was applied to have a dried thickness of 5 $\mu$m on one side on a zinc thin plate having a thickness of 50 $\mu$m. It was prebaked, exposed to a high voltage mercury lamp through a circuit pattern mask, developed by specified developing liquid and rinsing liquid, dried and postbaked to form the resist at the areas other than the land areas.

Then, using copper pyrophosphate plating bath prepared by Harshaw Murata, copper was electroplated to a thickness of 5 $\mu$m at a cathode current density of 1 A/dm$^2$ with the zinc thin plate being used as a cathode electrode, and the copper was electroplated by pulse plating to have a total thickness of 150 $\mu$m at a cathode current density of 20 A/dm$^2$. Phenol resin-nitrile rubber bonding agent Bostick "XA564-4" was applied to the electroplated zinc thin plates to have a dried thickness of 5 $\mu$m. The zinc thin plates were then hot pressed to both sides of polyparabanic acid film Shell Chemical "Tradlon" (having a film thickness of 25 $\mu$m) at 150° C. for 30 minutes with the zinc thin plate side facing up. The zinc thin plates were then etched by 5% by weight aqueous solution of sodium hydroxide. Through-holes were then drilled copper was further electroplated by pulse plating to have a thickness of 150 $\mu$m at a cathode current density of 20 A/dm$^2$. The resulting through-hole connected fine patterned thick film conductor structure had a circuit density of 8 lines/mm, film thickness of 300 $\mu$m, line width of 110 $\mu$m, line-to-line spacing of 15 $\mu$m and no ununiformity in the film thickness.

EXAMPLE 4

A negative photoresist Eastman Kodak "Microresist 752" was applied to have a dried thickness of 3 μm on one side on an aluminum thin plate having a thickness of 80 μm. It was prebaked, exposed to a high voltage mercury lamp through a circuit pattern mask, developed by specified developing liquid and rinsing liquid, dried and postbaked to form the resist at the areas other than the land areas.

Then, using copper pyrophosphate plating bath prepared by Harshaw Murata, copper was electroplated to have a thickness of 1 μm at a cathode current density of 0.5 A/dm$^2$ with the aluminum thin plate being used as a cathode electrode, and then copper was electroplated to have a total thickness of 50 μm at a cathode current density of 5 A/dm$^2$. Composition comprising 100 parts by weight of epoxy resin Asahi Kasei "AER-661", 25 parts by weight of Maruzen Sekiyu "Resin M" and 0.2 parts by weight of BF$_3$ piperidin was applied to have a dried thickness of 10 μm on the electroplated aluminum thin plates and they were hot pressed at 170° C. for 60 minutes with the aluminum thin plate side facing up. The aluminum thin plates were then etched by 14% by weight aqeuous solution of hydrochloric acid. Through-holes were then drilled and copper was further electroplated to the thickness of 50 μm at a cathode current density of 5 A/dm$^2$. The resulting through-hole connected fine-patterned thick film conductor structure had a circuit density of 8 line/mm, film thickness of 100 μm, line width of 105 μm, line width of 105 μm, line-to-line spacing of 20 μm and no ununiformity in the film thickness.

EXAMPLE 5

A negative photoresist Eastman Kodak "Microresist 747" was applied to have a dried thickness of 3 μm on an aluminum thin plate having a thickness of 40 μm. It was prebaked, exposed to a high voltage mercury lamp through a circuit pattern mask, developed by specified developing liquid and rinsing liquid, dried and postbaked to form the resist at the areas other than the land areas.

Then, using silver cyanide plating bath, silver was electroplated to a thickness of 1 μm at a cathode current density of 0.5 A/dm$^2$ with the aluminum thin plate being used as a cathode electrode, an then silver was electroplated to have a total thickness of 50 μm at a cathode current density of 5 A/dm$^2$. Phenol resin-nitrile rubber bonding agent Bostik "XA564-4" was applied to have a dried thickness of 5 μm on a polyimide film DuPont "Kapton" (having a thickness of 25 μm) to form an insulative substrate. The electroplated aluminum thin plate was hot pressed to the insulative substrate at 150° C. for 30 minutes with the aluminum thin plate side facing up. The aluminum thin plate was then etched by 5% by weight aqueous solution of sodium hydroxide. The resulting fine-patterned thick film conductor structure had a circuit density of 10 lines/mm, film thickness of 50 μm, line width of 75 μm, line-to-line spacing of 25 μm and no ununiformity in the film thickness.

EXAMPLE 6

A negative photoresist Eastman Kodak "Microresist 747" was applied to have a dried thickness of 3 μm on an aluminum thin plate having a film thickness of 40 μm. It was prebaked, exposed to a high voltage mercury lamp through a circuit pattern mask, developed by specified developing liquid and rinsing liquid, dried and postbaked to form the resist at the areas other than the land areas.

Then, using nickel sulfate plating bath, nickel was electroplated to the thickness of 1 μm at a cathode current density of 0.5 A/dm$^2$ with the aluminum thin plate being used as a cathode electrode, and then nickel was plated to have a total thickness of 50 μm at a cathode current density of 14 A/dm$^2$. Phenol resin-nitrile rubber bonding agent Bostik "XA 564-4" was applied to have a dried thickness of 5 μm on a polyimide film DuPont "Kapton" (having a film thickness of 25 μm) to form an insulative substrate. The electroplated aluminum thin plate was hot pressed to the insulative substrate at 150° C. for 30 minutes with the aluminum thin plate side facing up. The aluminum thin plate was then etched by 5% by weight aqueous solution of sodium hydroxide. The resulting fine-patterned thick film conductor structure had a circuit density of 10 lines/mm, film thickness of 50 μm, line width of 85 μm, line-to-line spacing of 15 μm and no ununiformity in the film thickness.

In Examples 1 to 6, no protrusion was observed in the sides of the conductor lines.

What is claimed is:

1. A method for manufacturing a fine-patterned thick film conductor structure comprising the steps of:
   (a) forming a resist on a thin metal plate at areas other than land areas and electroplating said land areas using said thin metal plate as a cathode electrode to form conductors having a circuit density of no less than 3 lines/mm and a film thickness of 15–200 μm, the cathode current density in the electroplating to said thin metal plate being between 0.05 and 2 A/dm$^2$ until the film thickness reaches 0.3–10 μm, and thereafter increasing to 3–50 A/dm$^2$;
   (b) bonding said electroplated thin metal plate to an insulative substrate with the thin metal plate side facing up, and
   (c) etching away said thin metal plate.

2. A method for manufacturing a fine-patterned thick film conductor structure according to claim 1 wherein said electroplated thin metal plates are bonded on both sides of said insulative substrate with the thin metal plate side facing up so that the conductor patterns of said plates face to each other.

3. A method for manufacturing a fine-patterned thick film conductor structure according to claim 1 or 2 further comprising the step of electroplating the exposed conductors after said thin metal plate has been etched to form conductor layers having a thickness of 15–200 μm whereby a substantial thickness of the conductors is attained without thickening the plated conductors.

4. A method for manufacturing a fine-patterned thick film conductor structure according to claim 2 further comprising the step of drilling through-holes at through-hole connection areas of the conductor pattern on said insulative substrate after said thin metal plates on both sides of said insulative substrate have been etched, and electroplating the exposed conductors to form conductor layers thereon having a thickness of 15–200 μm.

5. A method for manufacturing a fine-patterned thick film conductor structure according to claim 4 wherein a cathode current density in the electroplating to the exposed conductors after the etching of said thin metal plate is between 3 and 50 A/dm$^2$.

6. A method for manufacturing a fine-patterned thick film conductor structure according to claim 1, 2 or 4 wherein said thin metal film is selected from aluminum, tin and zinc having a thickness of 1–500 μm.

7. A method for manufacturing a fine-patterned thick film conductor structure according to claim 1, 2 or 4 wherein said conductor is copper.

8. A method for manufacturing a fine-patterned thick film conductor structure according to claim 1, 2 or 4 wherein said insulative substrate is a polymer film having a thickness of 5–200 μm.

9. A method for manufacturing a fine-patterned thick film conductor structure according to claim 3 wherein a cathode current density in the electroplating to the exposed conductors after the etching of said thin metal plate is between 3 and 50 A/dm$^2$.

10. A method for manufacturing a fine-patterned thick film conductor strcuture according to claim 3 wherein siad thin metal film is selected from aluminum, tin and zinc having a thickness of 1–500 μm.

11. A method for manufacturing a fine-patterned thick film conductor structure according to claim 3 wherein said conductor is copper.

12. A method for manufacturing a fine-patterned thick film conductor structure according to claim 3 wherein said insulative substrate is a polymer film having a thickness of 5–200 μm.

13. A method for manufacturing a fine-patterned thick film conductor structure according to claim 1 wherein said tin metal film is selected from aluminum, tin and zinc having a thickness of 1–500 μm.

14. A method for manufacturing a fine-patterned thick film conductor structure according to claim 5 wherein said thin metal film is selected from aluminum, tin and zinc having a thickness of 1–500 μm.

15. A method for manufacturing a fine-patterned thick film conductor structure according to claim 1 wherein said conductor is copper.

16. A method for manufacturing a fine-patterned thick film conductor structure according to claim 5 wherein said conductor is copper.

17. A method for manufacturing a fine-patterned thick film conductor structure according to claim 6 wherein said conductor is copper.

18. A method for manufacturing a fine-patterned thick film conductor structure according to claim 1 wherein a ratio of plated film thickness to line-to-line spacing is no smaller than 1.4 at a cathode current density of no smaller than 3 A/dm$^2$.

19. A method for manufacturing a fine-patterned thick film printed circuit board comprising the steps of:
   (a) forming a resist on a thin metal plate at areas other than land areas;
   (b) electroplating said thin metal plate to a thickness of 0.3–10 μm at a current density of 0.05–2 A/dm$^2$;
   (c) electroplating said thin metal plate to a desired film thickness at a current density of 3–20 A/dm$^2$ to form conductors on said land areas; and
   (d) removing all of the areas other than the land areas of said thin metal plate.

20. A method for manufacturing a fine-patterned thick printed circuit board according to claim 19 wherein a ratio of plated film thickness to line-to-line spacing is no smaller than 1.4 at a cathode current density of no smaller than 3 A/dm$^2$.

21. A method for manufacturing a fine-patterned thick film printed circuit board according to claim 19 further comprising a step of bonding said thin metal plate to an insulative substrate after said steps (a) to (c) and before said step (d).

* * * * *